United States Patent [19]

Murari et al.

[11] 4,072,908
[45] Feb. 7, 1978

[54] AUDIO AMPLIFIER WITH CONSTANT CURRENT CONSUMPTION

[75] Inventors: Bruno Murari, Monza (Milan); Pietro Menniti, Milan, both of Italy

[73] Assignee: SGS-ATES Componenti Elettronici S.p.A., Agrate Brianza (Milan), Italy

[21] Appl. No.: 761,404

[22] Filed: Jan. 21, 1977

[30] Foreign Application Priority Data

Jan. 22, 1976 Italy .................................. 19468/76

[51] Int. Cl.² ............................................ H03F 3/183
[52] U.S. Cl. ..................................... 330/265; 330/255; 330/266; 330/267
[58] Field of Search ....................... 330/13, 22, 23, 25, 330/30 D

[56] References Cited

U.S. PATENT DOCUMENTS

| 3,493,881 | 2/1970 | Zuch .............................. 330/30 D X |
| 3,904,974 | 9/1975 | Fukaya et al. ..................... 330/13 X |

FOREIGN PATENT DOCUMENTS

| 319,043 | 1/1972 | U.S.S.R. ................................. 330/13 |

*Primary Examiner*—James B. Mullins
*Attorney, Agent, or Firm*—Karl F. Ross

[57] ABSTRACT

A class-AB audio amplifier comprises, as a final stage, two complementary power transistors connected across a direct-current source in series with an output resistor whose junction with the first of these transistors is grounded through a capacitor. The bases of the power transistors are connected across a biasing resistance inserted between two complementary pilot transistors which are connected across the d-c source in series with a constant-current generator, one of these pilot transistors having its base connected to a signal input while the other forms part of a differential circuit also including a feedback transistor of the same conductivity type connected across the source in series with the constant-current generator. With the base of the last-mentioned pilot transistor held at a constant potential through a Zener diode and the base of the feedback transistor tied to the aforementioned junction, any change in the junction potential is compensated by a variation in the current flow through the biasing resistance modifying the conductivity of the first power transistor to keep its current substantially constant, that current flowing alternately into the second power transistor and into a capacitor connected across the latter transistor in series with a load.

8 Claims, 2 Drawing Figures

AUDIO AMPLIFIER WITH CONSTANT CURRENT CONSUMPTION

FIELD OF THE INVENTION

Our present invention relates to an amplifier for audio signals, more particularly to an amplifier of class AB.

BACKGROUND OF THE INVENTION

Amplifiers of class B or AB, in which at least the final stage draws current only during part of a signal cycle, have the advantage of greater output power in comparison with class-A amplifiers, enabling transistors of limited physical dimensions to produce large-amplitude output signals. This is particularly important for audio amplifiers realized with integrated circuitry.

In a larger system, in which such an amplifier is energized along with one or more additional amplifiers or other equipment from a common direct-current source, inconveniences arise from the fact that the current consumption of the amplifier varies with signal amplitude; this variation, of course, influences the operation of the remaining device or devices drawing current from the common source. A conventional solution of this problem (aside from the possibility of using a separate power supply for any amplifier of the class referred to) lies in the provision of a current sink connected in parallel with the amplifier of class B or AB and controlled to draw direct current at a rate complementary to that of the amplifier. This solution, evidently, is rather uneconomical in view of the wasteful energy dissipation in the current sink.

OBJECT OF THE INVENTION

The object of our present invention, therefore, is to provide an amplifier — particularly of class AB — which draws a substantially constant direct current from its power supply without the need for a compensatory current sink.

SUMMARY OF THE INVENTION

An amplifier embodying our present improvement comprises, in a manner known per se, a preliminary stage including pilot transistor means and a final stage including output transistor means connected in parallel with each other across a source of direct current, the pilot transistor means receiving the incoming audio signals and controlling the conduction of the output transistor means in response to these signals, by way of an interstage biasing circuit, for corresponding energization of a load. In accordance with our invention, the conduction control exerted by the biasing circuit is modified by current-sensing means, connected between the two stages, to maintain a substantially constant flow of direct current at least in the final amplifier stage.

In the embodiment more particularly described hereinafter, the preliminary stage includes a constant-current generator in series with a first and a second pilot transistor of opposite conductivity types, the current-sensing means comprising a feedback transistor connected to the constant-current generator for energization in parallel with the pilot transistors. The feedback transistor has an input (i.e. a base) tied to a junction between an output resistor and a first power transistor in the final stage, that stage also including a complementary second power transistor connected across the load circuit. The first pilot transistor, which is of the same conductivity type as the feedback transistor, has its input (base) tied to a point of fixed potential, advantageously via a Zener diode; the audio signals are applied to the input (base) of the second pilot transistor.

The biasing circuit comprises a pair of leads respectively extending from the inputs (i.e. bases) of the two power transistors to opposite ends of resistance means inserted between the two pilot transistors, more specifically between the collectors thereof. The biasing current flowing through the resistance means, which drives the two power transistors in push-pull, is modulated on the one hand by the incoming audio signal and on the other hand by changes in the junction potential between the output resistor and the first power transistor which, through the differential action of the circuit including the feedback transistor and the first pilot transistor, leads to a compensatory change in the distribution of the current emanating from the constant-current generator.

BRIEF DESCRIPTION OF THE DRAWING

The above and other features of our invention will now be described in detail with reference to the accompanying drawing in which.

SPECIFIC DESCRIPTION

Figure 1:
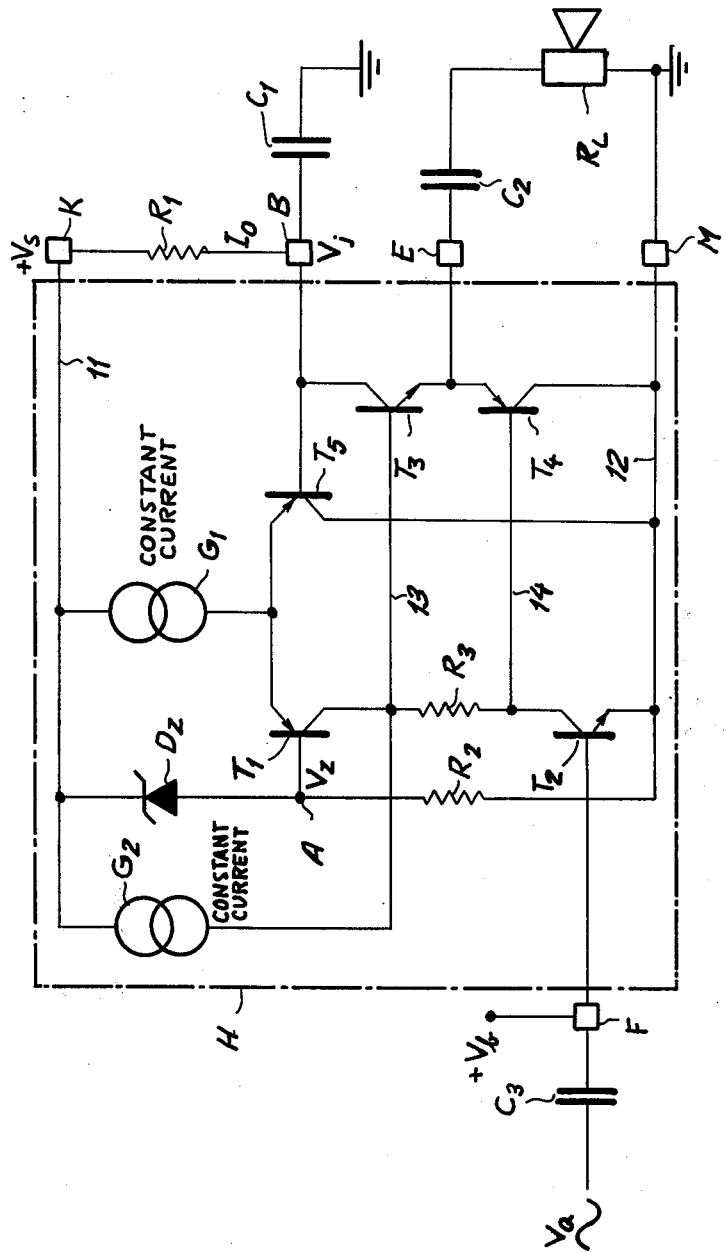
FIG. 1 is a circuit diagram of a class-AB audio amplifier embodying our invention.

The amplifier shown in FIG. 1, constituted by integrated circuitry within a dotted rectangle H, comprises a preliminary stage with a first pilot transistor $T_1$ of PNP type and a second pilot transistor $T_2$ of NPN type, a final stage with a first power transistor $T_3$ of NPN type and a second power transistor $T_4$ of PNP type, a biasing resistor $R_3$ inserted between the collectors of the two complementary pilot transistors, a constant-current generator $G_1$ in series with the two pilot transistors and resistor $R_3$, a PNP feedback transistor $T_5$ connected in parallel with these pilot transistors to generator $G_1$ between a pair of conductors 11 and 12, a Zener diode $D_Z$ connected in series with a resistor $R_2$ between these conductors, and another constant-current generator $G_2$ also connected between conductors 11 and 12 in series with resistor $R_3$ and transistor $T_2$. Conductor 11 is tied to a supply terminal K which is energized with a positive voltage $+V_s$ from a d-c source, not further illustrated, whose negative terminal M is grounded and tied to conductor 12.

The base of pilot transistor $T_1$ is connected to the junction A of Zener diode $D_Z$ with resistor $R_2$ to receive a constant biasing potential $V_z$. The base of feedback transistor $T_5$ is tied to a terminal B representing a junction point between the collector of power transistor $T_3$ and an external output resistor $R_1$ lying between terminals B and K. Terminal B is further connected to the opposite pole of the source, i.e. ground, via a capacitor $C_1$ defining with resistor $R_1$ an integrating network whose time constant preferably exceeds a cycle of the lowest audio frequency to be amplified.

A partly resistive load $R_L$, such as a loudspeaker, is shown connected between ground terminal M and another terminal E by way of a blocking capacitor $C_2$, terminal E being tied to the interconnected emitters of power transistors $T_3$ and $T_4$. The base of pilot transistor $T_2$ is connected to a terminal F which receives incoming audio signals $V_a$ through a coupling capacitor $C_3$ and is biased at a suitable positive potential $+V_b$, considerably lower than supply voltage $+V_s$, whose magnitude is less than the average signal amplitude so that transistor $T_2$ conducts only during part of a negative half-cycle. The collectors of the two pilot transistors $T_1$, $T_2$, and therefore the two ends of resistor $R_3$, are connected to the bases of power transistors $T_3$, $T_4$ by way of respective leads 13, 14 forming part of a biasing circuit for the latter transistors.

In operation, but in the presence of an audio signal $V_a$, transistor $T_2$ conducts and draws current from both generators $G_1$ and $G_2$ to develop a voltage drop across resistor $R_3$ whereby the two complementary power transistors $T_3$ and $T_4$ are rendered conductive, drawing a constant repose current $I_0$ from the power supply through output resistor $R_1$. The resulting voltage drop across the latter resistor produces a junction potential $V_j$ at terminal B which may be so chosen, with reference to the Zener voltage $V_z$ at point A, that a suitable portion of the generator current traverses the resistor $R_3$.

Upon the appearance of an input signal $V_a$, the collector/emitter resistance of transistor $T_2$ changes along with the biasing voltages on leads 13 and 14 whereby the conductivity of power transistors $T_3$ nd $T_4$ varies in opposite senses. With signals above a certain amplitude threshold, transistor $T_2$ cuts off completely during part of a negative half-cycle and so does transistor $T_4$. With transistor $T_3$ saturated during that cut-off phase, the current traversing the resistor $R_1$ divides between capacitors $C_1$ and $C_2$, part of it flowing through the load $R_L$. During positive half-cycles, transistors $T_2$ and $T_4$ become highly conductive and cause the discharge of capacitor $C_2$ with reversal of the load current.

If transistor $T_3$ were cut off during conduction of transistor $T_4$, a charge depending on signal amplitude would build up on capacitor $C_1$ and would thereby drive the junction B more positive so that the output current through resistor $R_1$ would decrease. An increase in junction potential $V_j$, however, lowers the conductivity of feedback transistor $T_5$ which results in a reduction of the internal resistance of constant-current generator $G_1$ for a complementary reduction of the voltage drop thereacross with maintenance of the rated output current. An increased portion of this output current now passes through pilot transistor $T_1$, biasing resistor $R_3$ and pilot transistor $T_2$; this drives the lead 13 more positive and therefore enhances the conductivity of transistor $T_3$. Obviously, a reduction of potential $V_j$ below its normal value would have the opposite compensatory effect.

Thus, the circuit arrangement according to our invention maintains a substantially constant voltage drop across resistor $R_1$ and therefore a current flow through that resistor which remains close to its repose value $I_0$ irrespectively of signal amplitude. Since generators $G_1$ and Zener diode $D_Z$ also draw practically constant currents, and since the current of generator $G_2$ (less than 7 milliamp) is negligible compared with the current flowing through the power transistors $T_3$ and $T_4$ (about 0.5 to 1 amp), the total current consumption of the amplifier is substantially invariant.

Figure 2:
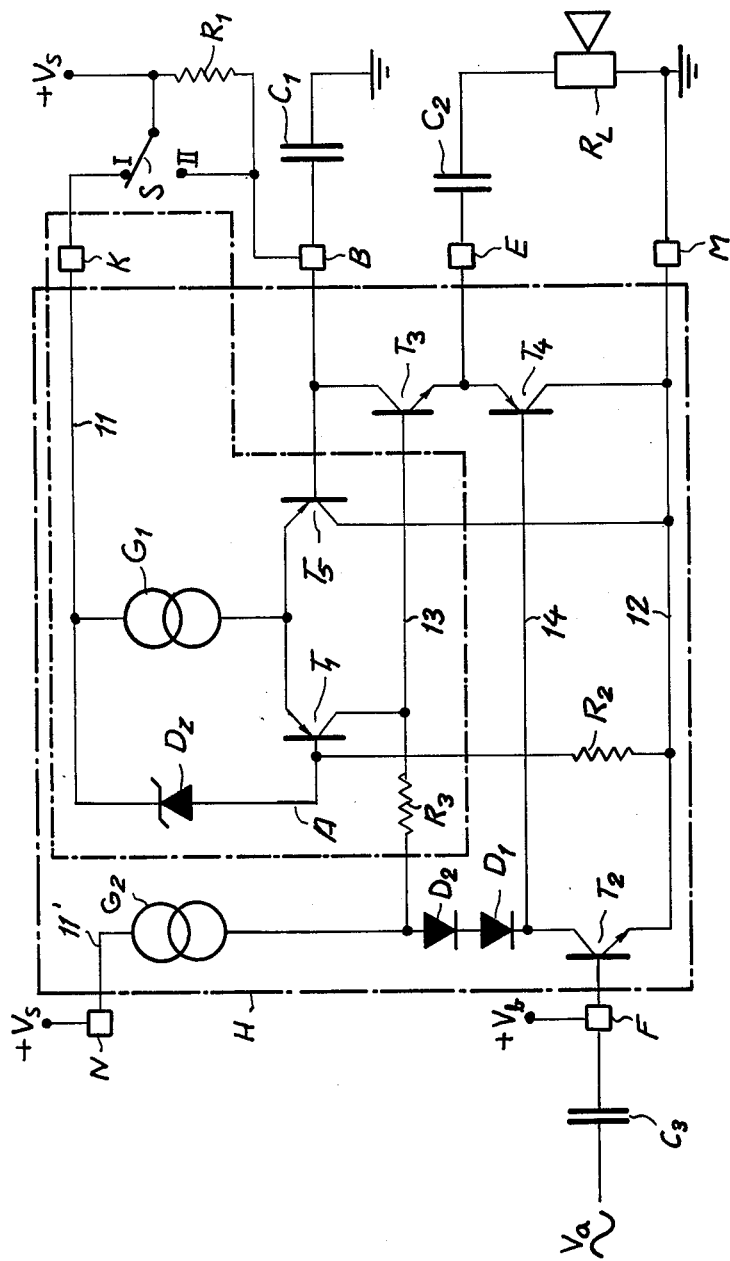
FIG. 2 is a circuit diagram similar to FIG. 1, illustrating a modification.

In FIG. 2, we have shown a similar amplifier wherein, however, the biasing resistance between the collectors of pilot transistors $T_1$ and $T_2$ includes the forward resistances of two cascaded diodes $D_1$ and $D_2$ in series with resistor $R_3$. Diodes $D_1$ and $D_2$ have thermal coefficients of conductivity substantially equaling those of the base/emitter paths of power transistors $T_3$ and $T_4$ in order to balance, in a manner known per se, the effect of thermal changes upon the conduction of these transistors.

As further shown in FIG. 2, constant-current generator $G_2$ is connected to supply voltage $+V_s$ via an ancillary conductor 11′ and a terminal N, this generator feeding only the diodes $D_1$ and $D_2$ in series with transistor $T_2$ but supplying virtually no current to biasing resistor $R_3$. A switch S, normally engaging a contact I, connects terminal K and conductor 11 to supply voltage $+V_s$ so that the system of FIG. 2 operates in essentially the same manner as that of FIG. 1. An optional reversal of switch S, from contact I to an alternate contact II, short-circuits the output resistor $R_1$ and disconnects transistors $T_1$ and $T_5$ as well as generator $G_1$ and Zener diode $D_Z$ from the supply so that the amplifier operates in the conventional manner, e.g. when driven in class A or when no other devices affected by a change in current consumption are connected to the same power supply.

We claim:
1. An amplifier for audio signals, comprising:
a source of direct current having a first and a second terminal:
an output resistor and a constant-current generator connected to said first terminal;
a preliminary stage including pilot transistor means connected between said constant-current generator and said second terminal;
a final stage including a first and a second power transistor serially connected between said output resistor and said second terminal, said first power transistor forming a junction with said output resistor;
input means for feeding audio signals to said pilot transistor means;
a biasing circuit extending from said preliminary stage to said final stage for controlling the conduction of said power transistors in response to said audio signals;
a load circuit connected across said second power transistor for energization by said final stage; and
current-sensing means connected between said final stage and said preliminary stage for modifying the control of said conduction by said biasing circuit to maintain a substantially constant flow of direct current in said final stage, said current-sensing means comprising a feedback transistor with an input tied to said junction, said feedback transistor being connected between said constant-current generator and said second terminal in parallel with said pilot transistor means.

2. An amplifier as defined in claim 1 wherein said pilot transistor means comprises a first and a second pilot transistor of opposite conductivity types in series with each other, said feedback transistor being of the same conductivity type as said first pilot transistor and forming therewith a differential circuit, said first pilot transistor having an input tied to a point of fixed potential, said second pilot transistor being connected to said input means for receiving said audio signals.

3. An amplifier as defined in claim 2 wherein said first and second power transistors are of opposite conductivity types.

4. An amplifier as defined in claim 3 wherein said preliminary stage further includes resistance means inserted between said first and second pilot transistors, said biasing circuit comprising a pair of leads extending from opposite ends of said resistance means to respective inputs of said first and second power transistors.

5. An amplifier as defined in claim 4 wherein said first and second pilot transistor have collectors respectively tied to said opposite ends of said resistance means, said first and second power transistors having interconnected emitters, said load circuit including a blocking capacitor inserted between said interconnected emitters and a load, said junction being connected to a terminal of said source through an integrating capacitor.

6. An amplifier as defined in claim 5 wherein said inputs of said first and second power transistors are bases, said resistance means including forwardly biased diode means of substantially the same thermal coefficient of conductivity as the base emitter paths of said first and second power transistors.

7. An amplifier as defined in claim 2, further comprising switch means selectively operable to short-circuit said output resistor with simultaneous deactivation of said differential circuit.

8. An amplifier as defined in claim 2, further comprising another constant-current generator connected across the series combination of said first pilot transistor and the first-mentioned constant-current generator.

* * * * *